United States Patent
Okubo et al.

(10) Patent No.: US 7,221,132 B2
(45) Date of Patent: May 22, 2007

(54) POWER SUPPLY CIRCUIT (75) Inventors: Takuya Okubo, Kyoto (JP); Ko Takemura, Kyoto (JP)

(73) Assignee: Rohm Co. Ltd., Kyoto (JP)

(*) Notice: Subject to any disclaimer, the term of this patent is extended or adjusted under 35 U.S.C. 154(b) by 302 days.

(21) Appl. No.: 10/872,455

(22) Filed: Jun. 22, 2004

(65) Prior Publication Data
US 2004/0257053 A1 Dec. 23, 2004

(30) Foreign Application Priority Data
Jun. 23, 2003 (JP) ............................. 2003-177473

(51) Int. Cl.
G05F 1/40 (2006.01)
G05F 1/56 (2006.01)
H02J 3/12 (2006.01)

(52) U.S. Cl. ..................................... 323/280; 323/271

(58) Field of Classification Search ................ 323/265, 323/271, 273, 275, 279, 280, 281, 282, 285
See application file for complete search history.

(56) References Cited

U.S. PATENT DOCUMENTS 6,208,123 B1 * 3/2001 Sudo ........................ 323/280
6,333,623 B1 * 12/2001 Heisley et al. .............. 323/280
6,492,796 B1 * 12/2002 Morley ....................... 323/316
6,809,616 B2 * 10/2004 Liu et al. .................... 333/214
7,068,103 B2 * 6/2006 Lind .......................... 330/251

FOREIGN PATENT DOCUMENTS

| JP | 2-9914 U | 1/1990 |
|---|---|---|
| JP | 5-204476 A | 8/1993 |
| JP | 6-332550 A | 12/1994 |
| JP | 08-190437 | 7/1996 |
| JP | 2002-076779 A | 3/2002 |

* cited by examiner

Primary Examiner—Matthew V. Nguyen
(74) Attorney, Agent, or Firm—Arent Fox LLP (57) ABSTRACT A power supply circuit relating to the present invention comprises a differential amplifier for feeding out a voltage as a control voltage in accordance with a difference between a feedback voltage commensurate with an output voltage and a reference voltage, an output current control element for feeding out an output current in accordance with the control voltage fed thereto from the differential amplifier, an output line by way of which the output current is supplied to a load, a feedback line by way of which a voltage on the output line is fed back as the feedback voltage to the differential amplifier, the feedback line connected to the output line, and a sink current generating circuit, connected between the feedback line and ground, for generating a sink current by which the control voltage fed to the output current control element is raised to a predetermined value.

10 Claims, 5 Drawing Sheets

Prior Art

POWER SUPPLY CIRCUIT

This application is based on Japanese Patent Application No. 2003-177473 filed on Jun. 23, 2003, the contents of which are hereby incorporated by reference.

BACKGROUND OF THE INVENTION

1. Field of the Invention

The present invention relates to a power supply circuit for supplying a predetermined voltage to a load. More particularly, the present invention relates to a power supply circuit having a function of suppressing fluctuations in output voltage thereof caused by load fluctuations.

2. Description of the Prior Art

Figure 4:
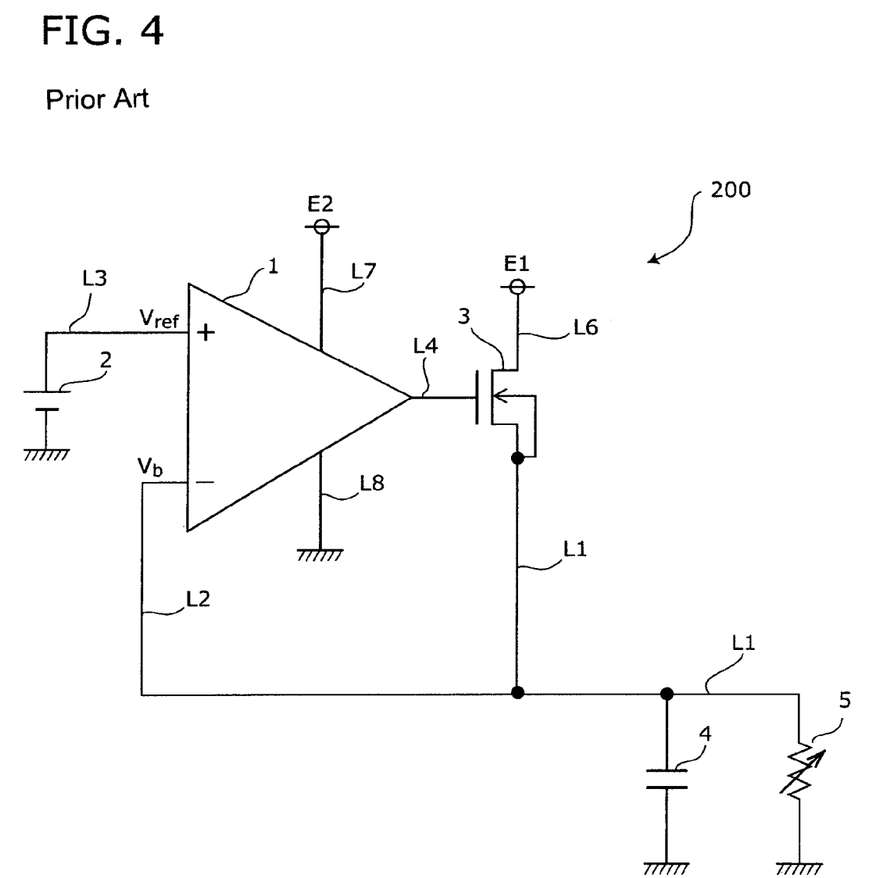
FIG. 4 is a circuit diagram of an n-channel FET driver included in a conventional power supply circuit.

FIG. 4 is a circuit diagram of an n-channel FET driver 200 included in a conventional power supply circuit. In this n-channel FET driver 200, a positive side of a reference voltage source 2 is connected to a non-inverting input terminal (+ terminal) of a differential amplifier 1 by way of a line L3, and a feedback line L2 is connected to an inverting input terminal (− terminal) of the differential amplifier 1. A negative side of the reference voltage source 2 is grounded. Moreover, a gate of an n-channel FET 3 (hereinafter FET 3), i.e., an output current control element, is connected to an output terminal of the differential amplifier 1 by way of a line L4.

A drain of the FET 3 is connected to a first power supply E1 by way of a line L6, and a source of the FET 3 is connected to an output line L1. The feedback line L2, while being connected to the inverting input terminal (− terminal) of the differential amplifier 1, is also connected to the output line L1. One side of a capacitor 4 and one side of a load 5 are connected to this output line L1 respectively. Another side of the capacitor 4 and another side of the load 5 are connected to ground respectively.

The differential amplifier 1 converts a difference between a reference voltage Vref fed to the non-inverting terminal (+ terminal) thereof from the reference voltage source 2 and a feedback voltage Vb fed to the inverting terminal (− terminal) thereof through the feedback line L2 into a current according to a voltage-current conversion efficiency defined by a mutual conductance (or gain) Gm of the differential amplifier 1. The current thus converted is fed to the gate of the FET 3 through the line L4. This differential amplifier 1 is also connected to a second power supply E2 through a power supply line L7 and to ground through a grounding line L8.

Described hereinafter is how the n-channel FET driver 200 configured as above operates.

The differential amplifier 1 converts the difference between the reference voltage Vref fed to the non-inverting terminal (+ terminal) thereof from the reference voltage source 2 through the line L3 and the feedback voltage Vb fed to the inverting terminal (− terminal) thereof through the feedback line L2 into a current at the conversion efficiency in accordance with the mutual conductance Gm of the differential amplifier 1. The output current thus converted is fed to the gate of the FET 3 through the line L4. Accordingly, the FET 3 passes a source current thereof in accordance with the gate current thereof through the output line L1. Then, a voltage resulted from the source current is supplied to the load 5 as an output voltage Vo that also appears on the feedback line L2 as the feedback voltage Vb.

Figure 5A:
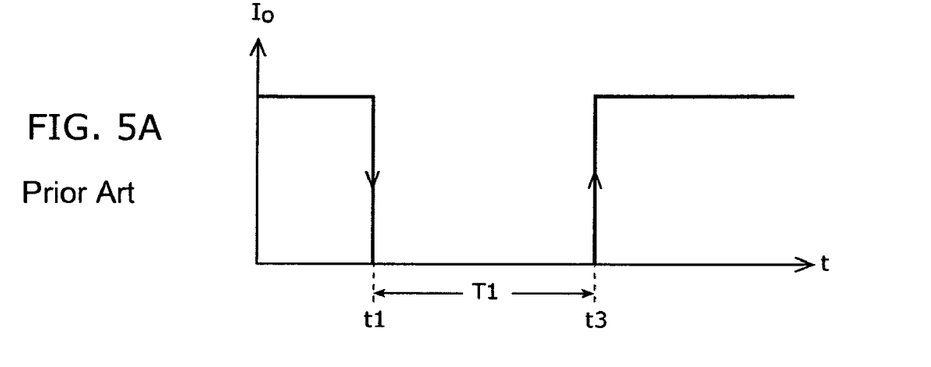
FIG. 5A is a waveform diagram showing an output current of the n-channel FET driver included in the conventional power supply circuit.
Figure 5B:
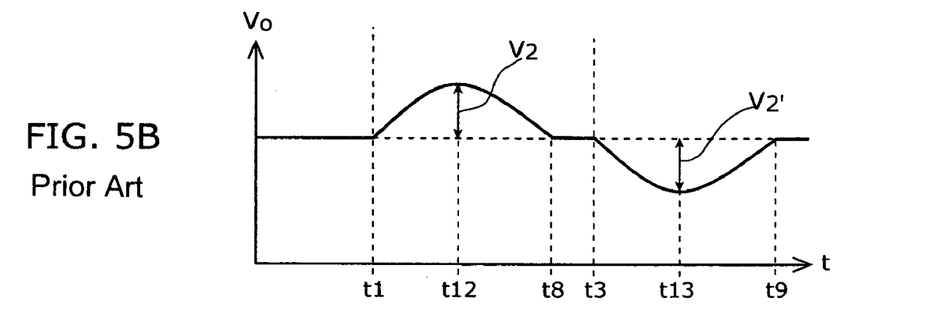
FIG. 5B is a waveform diagram showing an output voltage of the n-channel FET driver included in the conventional power supply circuit.
Figure 5C:
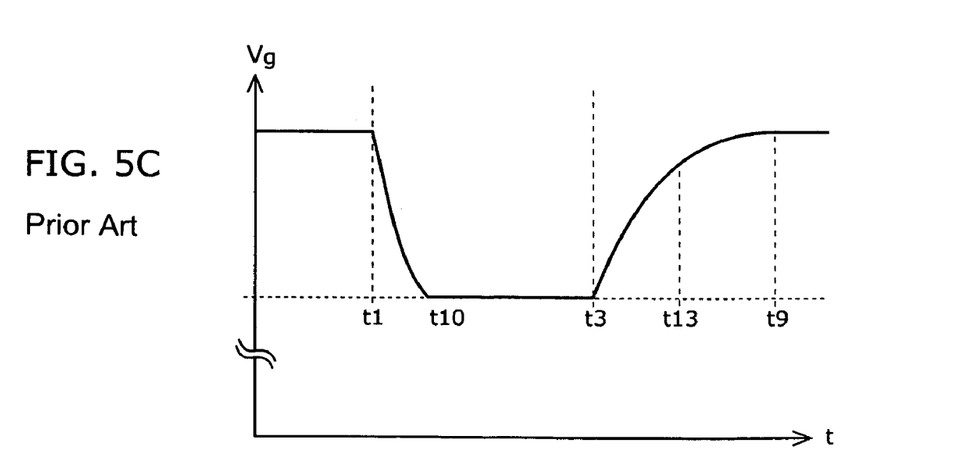
FIG. 5C is a waveform diagram showing a gate voltage of an output current control element in the n-channel FET driver included in the conventional power supply circuit.

For example, assume that the load 5 changes from a heavy load to no load. Then, as shown in FIG. 5A, an output current (load current) Io becomes zero during a period T1 in which no load is applied. When the load 5 becomes a heavy load again after the period T1, the level of the output current Io becomes that under the heavy-load condition. The output voltage (load voltage) Vo changes according to changes of the output current Io as shown in FIG. 5B. In addition, a gate voltage Vg of the FET 3 changes as shown in FIG. 5C. All of these are the results of the operations described below.

When the load 5 changes from a heavy load to no load and the output current Io becomes zero, the output voltage Vo starts rising at a time point t1 and onward due to a transient phenomenon. The output voltage Vo increases by a voltage V2 at a time point t12 and returns to a predetermined voltage at a time point t8. The gate voltage Vg that is fed to the gate of the FET 3 from the differential amplifier 1 drops at the time point t1 and turns off at a time point t10 so as to curb the increase of the output voltage Vo. Thereafter, the gate voltage Vg is held at an L-level until a time point t3 during which the FET 3 remains off.

In other words, when the load 5 changes from a heavy load to no load, the output current Io becomes zero at the time point t1. However, the output voltage Vo is raised by a depth of the voltage V2 due to a transient phenomenon after the time point t1. Here, the voltage V2 is relatively high, and individual periods from the time point t1 to the time point t12 and from the time point t1 to the time point t8 are also relatively long.

Next, at the time point t3, the load 5 changes from no load to a heavy load. Then the output current Io starts flowing through the load 5. Furthermore, the output voltage Vo starts descending at the time point t3 and onward due to a transient phenomenon and drops by a voltage V2' at the time point t13. Thereafter, the output voltage Vo starts rising so as to return to the predetermined voltage at a time point t9. The voltage V2' is large in depth, and individual periods from the time point t3 to the time point t13 and from the time point t3 to the time point t9 are relatively long.

However, in the conventional power supply circuit configured as above, when the load 5 changes from a heavy load to no load or to a light load, the larger the capacitance of the capacitor 4 is, the longer time it takes for the output voltage Vo to return to its predetermined voltage from its raised position. Because of this reason, fluctuation values of the output voltage Vo become larger, and thereby the transient response required for quickly stabilizing the output voltage Vo is worsened.

Furthermore, when the load 5 changes from no load or a light load to a heavy load as described above, the gate voltage of the FET 3 must respond and rise from a low voltage. Therefore, the response of the FET 3 is delayed according to the gate voltage thereof, which worsens the transient response on start-up of the load 5. In the conventional power supply circuit configured in this way, the slow transient response does not cause any serious harm when the load fluctuating frequency is low. However, when the load fluctuating frequency is high, it becomes impossible to stabilize the output voltage Vo quickly, because the FET 3 is unable to respond to that high frequency.

In addition, there is another type of conventional power supply circuit in which a current in the order of a few mA is drawn into the differential amplifier also under no-load condition so as to suppress fluctuations of the output voltage caused by fluctuations in the load by reducing an impedance component or the like of an output feedback resistor. However, because the output feedback resistor is used, also in this case, the larger the capacitance of a capacitor connected in parallel to the load becomes, the longer time it takes for the output voltage to return to its predetermined voltage from its raised position when the load changes from a heavy load to no load or to a light load. Because of this reason, fluctuations of the output voltage become larger, and thereby the transient response required for quickly stabilizing the output voltage is worsened.

A semiconductor device and a supply voltage generating circuit disclosed in Japanese Patent Application Laid-Open No. H08-190437 uses a p-channel FET as an output current control element. In this configuration, an input voltage required for the p-channel FET should be set higher, which worsens its output efficiency. This disclosure also has a shortcoming in which two resistor elements are used for suppressing the amplitude of an output signal fed from a comparator circuit, thereby causing unnecessary power consumption.

SUMMARY OF THE INVENTION

An object of the present invention is to solve the problems mentioned above and to provide a power supply circuit capable of suppressing fluctuations of the output voltage under fluctuating load conditions to a minimum by improving the transient response, and also to provide a power supply circuit capable of reducing unnecessary power consumption.

To achieve the above objects, a power supply circuit relating to the present invention comprises a differential amplifier for feeding out a voltage as a control voltage in accordance with a difference between a feedback voltage commensurate with an output voltage and a reference voltage, an output current control element for feeding out an output current in accordance with the control voltage fed thereto from the differential amplifier, an output line by way of which the output current is supplied to a load, a feedback line by way of which a voltage on the output line is fed back as the feedback voltage to the differential amplifier, the feedback line connected to the output line, and a sink current generating circuit, connected between the feedback line and ground, for generating a sink current by which the control voltage fed to the output current control element is raised to a predetermined value.

According to the power supply circuit configured in this way, the power supply circuit is designed in such a way that the control voltage fed to the output current control element is raised to the predetermined voltage by a sink current generated by the sink current generating circuit so that the output current control element is capable of responding faster when the load changes from no load or a light load to a heavy load. More particularly, the output voltage drops instantaneously due to a transient phenomenon when the load changes from no load or a light load to a heavy load. However, the output current control element can respond faster, because the control voltage of the output current control element is raised to the predetermined voltage by the sink current generated by the sink current generating circuit. This makes it possible to reduce fluctuations of the output voltage caused by fluctuations of the load to a minimum and improve properties in the transient response.

Even if the output voltage is raised when the load is changed from a heavy load to no load or to a light load, it is possible to bring the output voltage back to the predetermined value. This makes it possible to reduce fluctuations of the output voltage caused by fluctuations of the load to a minimum and improve properties in the transient response.

According to another aspect of the present invention, a constant current source is used as the sink current generating circuit. Because of this reason, it becomes possible to produce a constant sink current and, thereby, raise the control voltage of the output current control element to the predetermined voltage accurately.

According to still another aspect of the present invention, a switching element is provided so that the switching element turns on in synchronization with a signal that turns off the output current control element connected between the feedback line and ground. With this arrangement, when the load changes from a heavy load to no load or to a light load and when the output voltage is raised due to a transient phenomenon, the switching element swiftly removes the electrical charge from the capacitance component existing between the output line and ground. This makes it possible to further suppress the fluctuations of the output voltage caused by load fluctuations, and, in addition, improve properties in the transient response.

According to another aspect of the present invention, for a configuration in which a capacitor is connected between the output line and ground, at least the electrical charge stored in the capacitor is removed when the switching element is turned on. Therefore, when the load changes from a heavy load to no load or to a light load and when the output voltage is raised due to a transient phenomenon, the electrical charge stored in the capacitor is removed swiftly. This makes it possible to further suppress the fluctuations of the output voltage caused by load fluctuations, and, in addition, improve properties in the transient response.

According to still another aspect of the present invention, an n-channel FET (field-effect transistor) is used as the switching element. For this reason, the FET can operate even if the input voltage is low. This makes it possible to reduce power consumption and increase the operating efficiency thereof.

According to still another aspect of the present invention, an n-channel FET (field-effect transistor) is used as the output current control element. For this reason, the FET can operate even if the input voltage is low. This makes it possible to supply the output voltage to the load efficiently and reduce power consumption.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
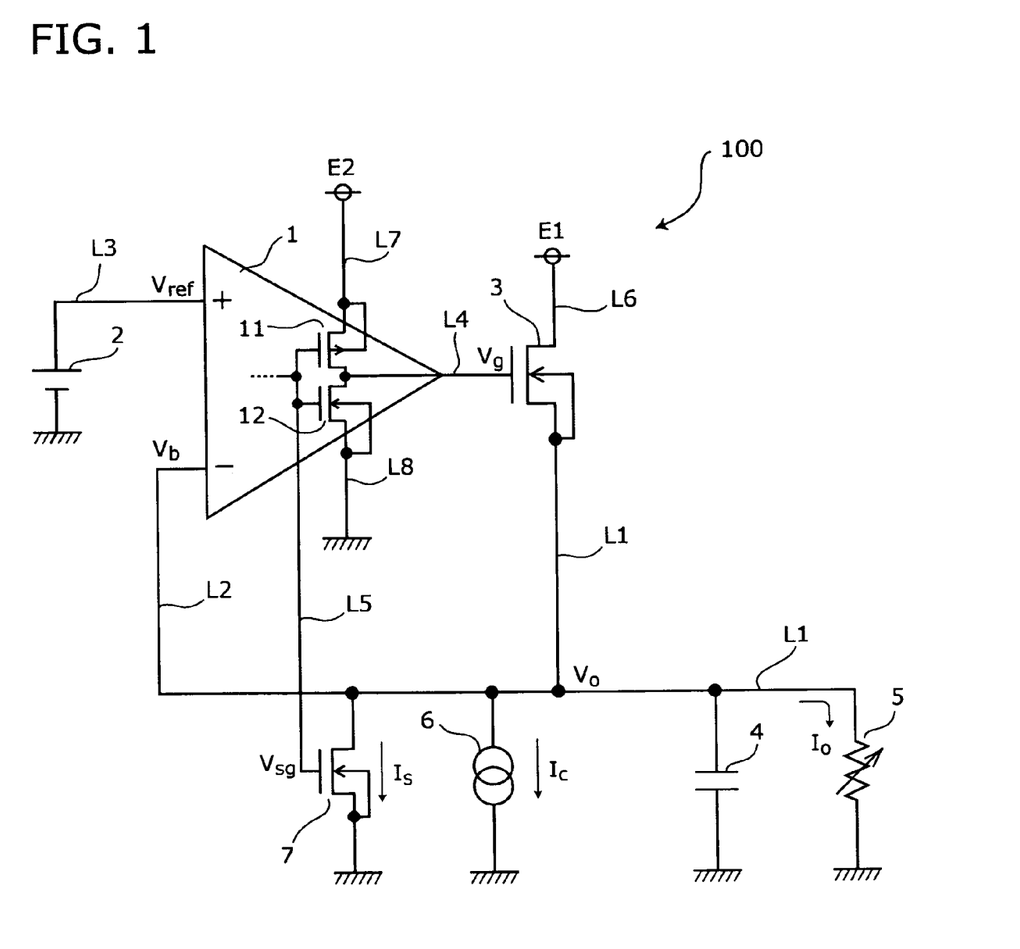
FIG. 1 is a circuit diagram of an n-channel FET driver included in a power supply circuit embodying the invention.

Hereinafter, an embodiment of the present invention will be described with reference to the drawings. FIG. 1 is a circuit diagram of an n-channel FET driver 100 included in a power supply circuit embodying the invention. In this n-channel FET driver 100, a positive side of a reference voltage source 2 is connected to a non-inverting input terminal (+ terminal) of a differential amplifier 1 by way of a line L3, and a feedback line L2 is connected to an inverting input terminal (− terminal) of the differential amplifier 1. A negative side of the reference voltage source 2 is grounded. Moreover, a gate of an n-channel FET 3 (hereinafter FET 3), i.e., an output current control element, is connected to an output terminal of the differential amplifier 1 by way of a line L4.

A drain of the FET 3 is connected to a first power supply E1 by way of a line L6, and a source of the FET 3 is connected to an output line L1. One side of a constant current source 6 and a drain of an n-channel FET 7 (hereinafter FET 7), i.e., a switching element, are connected respectively to the feedback line. L2 which is connected to the inverting input terminal (− terminal) of the differential amplifier 1. The feedback line L2 and the output line L1 are connected together. Connected to this output line L1 respectively are one side of a capacitor 4 and one side of a load 5. A source of the FET 7, another side of the constant current source 6, another side of the capacitor 4, and another side of the load 5 are connected to ground respectively.

In the differential amplifier 1, there are provided a p-channel FET 11 (hereinafter FET 11) and an n-channel FET 12 (hereinafter FET 12) connected in series between a power supply line L7 through which a voltage of a second power supply E2 is supplied and a grounding line L8. A source of the FET 11 is connected to the power supply line L7, and a drain of the FET 11 is connected to a drain of the FET 12. A source of the FET 12 is connected to ground through the grounding line L8. Gates of the FET 11 and the FET 12 are connected together and connected to a gate of the FET 7 through a line L5.

The differential amplifier 1 converts a difference between a reference voltage Vref fed to the non-inverting terminal (+ terminal) thereof from the reference voltage source 2 and a feedback voltage Vb fed to the inverting terminal (− terminal) thereof through the feedback line L2 into a current according to a voltage-current conversion efficiency defined by a mutual conductance (or gain) Gm of the differential amplifier 1. The current thus converted is fed to the gate of the FET 3 through the line L4.

Described hereinafter is how the n-channel FET driver 100 configured as above operates.

The differential amplifier 1 converts the difference between the reference voltage Vref fed to the non-inverting terminal (+ terminal) thereof from the reference voltage source 2 and the feedback voltage Vb fed to the inverting terminal (− terminal) thereof through the feedback line L2 into a current at the conversion efficiency in accordance with the mutual conductance (or gain) Gm of the differential amplifier 1. The output current thus converted is fed to the gate of the FET 3 through the line L4. Accordingly, the FET 3 passes a source current thereof in accordance with the gate current thereof through the output line L1. Then, a voltage resulted from the source current is supplied to the load 5 as an output voltage Vo that also appears on the feedback line L2 as the feedback voltage Vb.

Figure 2A:
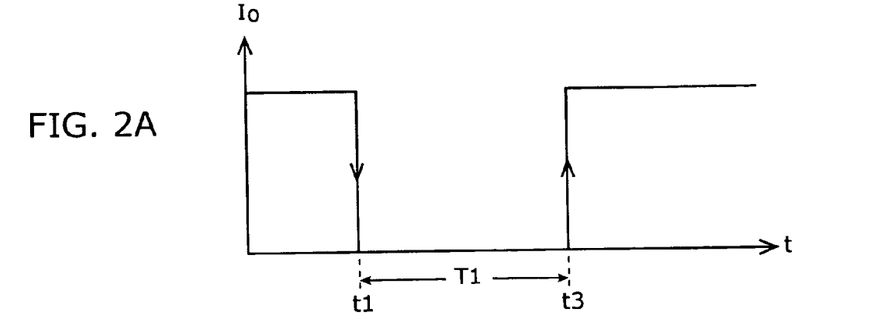
FIG. 2A is a waveform diagram showing an output current of the n-channel FET driver included in the power supply circuit embodying the invention.
Figure 2B:
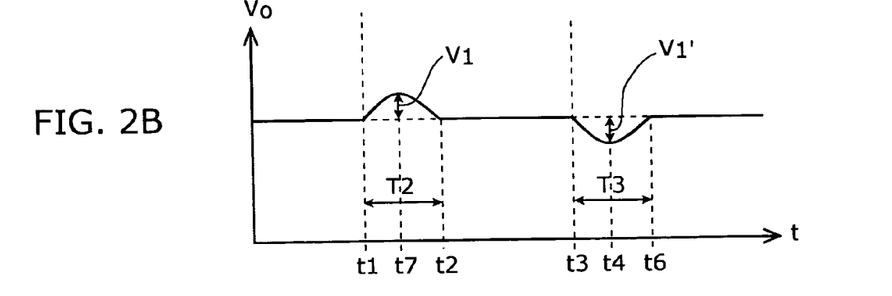
FIG. 2B is a waveform diagram showing an output voltage of the n-channel FET driver included in the power supply circuit embodying the invention.
Figure 2C:
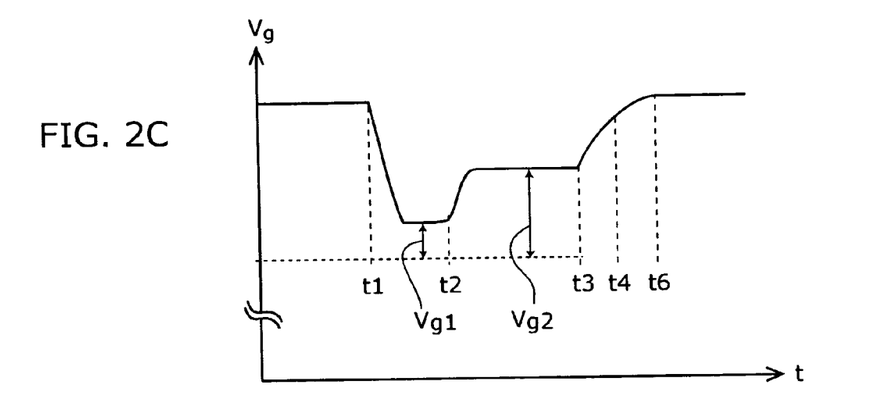
FIG. 2C is a waveform diagram showing a gate voltage of an output current control element in the n-channel FET driver included in the power supply circuit embodying the invention.

For example, assume that the load 5 changes from a heavy load to no load. Then, as shown in FIG. 2A, an output current (load current) Io becomes zero during a period T1 in which no load is applied. When the load 5 becomes a heavy load again after the period T1, the level of the output current Io becomes that under a heavy-load condition. The output voltage (load voltage) Vo changes as shown in FIG. 2B according to changes of the output current Io. In addition, a gate voltage Vg of the FET 3 changes as shown in FIG. 2C. All of these are the results of the operations described below.

Figure 2D:
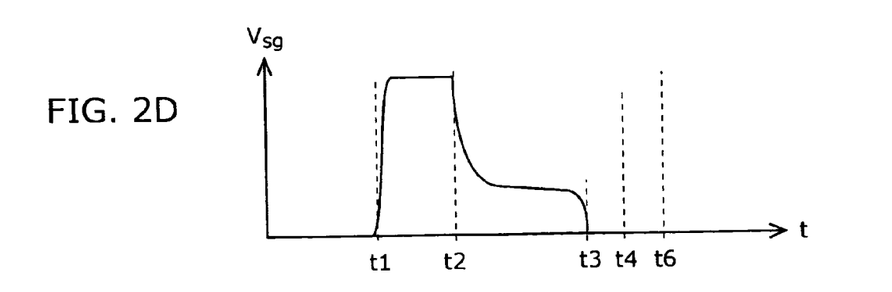
FIG. 2D is a waveform diagram showing a gate voltage of a switching element in the n-channel FET driver included in the power supply circuit embodying the invention.

When the load 5 changes from the heavy load to no load and the output current Io becomes zero, the output voltage Vo starts rising. The differential amplifier 1 feeds out an L-level signal at a time point t7 at which the output voltage Vo rises by a voltage V1 in a period T2 between a time point t1 and a time point t2. After these steps, an L-level signal is fed to the gate of the FET 3 so that the FET 3 turns off. At this point, as indicated by a voltage Vsg in FIG. 2D, an H-level signal in synchronization with the aforementioned L-level signal is fed to the gate of the FET 7 through the line L5. By this signal, the FET 7 is turned on for a very short period of time. The FET 7, thus activated, removes the electrical charge from the capacitor 4 quickly. In this way, a rise in the output voltage Vo is reduced and, therefore, the fluctuations of the output voltage Vo due to load fluctuations are suppressed and a response to load fluctuations is improved.

Furthermore, a sink current Ic flows from the first power supply E1 through the FET 3 to the constant current source 6. As a result, when the load 5 changes from the heavy load to no load, as shown in FIG. 2C, a raised gate voltage Vg1, when compared with a case without the sink current Ic, is developed by the sink current Ic that flows into the constant current source 6 through the FET 3 after the FET 7 has been turned on, as explained before with reference to FIG. 2D, for a very short period of time between the time point t1 and the time point t2. The development of the raised gate voltage Vg1 makes the FET 3 to respond quickly so that the output voltage Vo can be brought back to the predetermined voltage rapidly. In this way, it is possible to suppress the fluctuations of the output voltage Vo caused by the fluctuations in load and also improve properties in the transient response.

More specifically, when the load 5 changes from the heavy load to no load, the output current Io becomes zero at the time point t1. However, the output voltage Vo rises by the voltage V1 due to the transient phenomenon at the time point t7 in the period T2 between the time point t1 and the time point t2. However, the voltage V1 is smaller when compared to the conventional level, and a period between the time point t1 and the time point t7 and the period T2 between the time point t1 and the time point t2 are shorter so that the transient response of the output voltage Vo is improved. Additionally, the gate voltage Vg fed to the FET 3 is raised by the sink current Ic that is pulled in by the constant current source 6 during a period between the time point t2 and the time point t3 as shown in FIG. 2C. This makes it possible to increase the response speed when the load 5 changes from no load to a heavy load.

Next, assume that the load 5 changes from no load to a heavy load at the time point t3. Then, the output current Io flows through the load 5. The output voltage Vo, due to a transient phenomenon, starts dropping at the time point t3 and finally drops by a voltage V1' at a time point t4. Thereafter, the output voltage Vo starts rising and returns to the predetermined voltage at a time point t6. However, the voltage V1' is smaller when compared to the conventional level, and a period between the time point t3 and the time point t4 and a period T3 between the time point t3 and the time point t6 are shorter when compared to the conventional periods so that the transient response of the output voltage Vo is improved.

More specifically, prior to the load 5 changing to the heavy load from no load at the time point t3, the gate voltage Vg that has dropped to an L-level (e.g., raised gate voltage Vg1) is raised to a certain level (e.g., raised gate voltage Vg2) at the time point t2, as shown in FIG. 2C, by the effect of the sink current Ic that is pulled in by the constant current source 6. In other words, first, the gate voltage Vg is raised to a certain level and, then, the differential amplifier 1 responds to load fluctuations when load 5 changes to the heavy load and turns the gate voltage Vg to an H-level. As a result, the period between the time point t3 and the time point t4 becomes shorter when compared to the conventional length. Although the output voltage Vo drops by the voltage V1' at the time point t4, the predetermined voltage will be supplied to the load 5 after the time point t6.

Figure 3A:
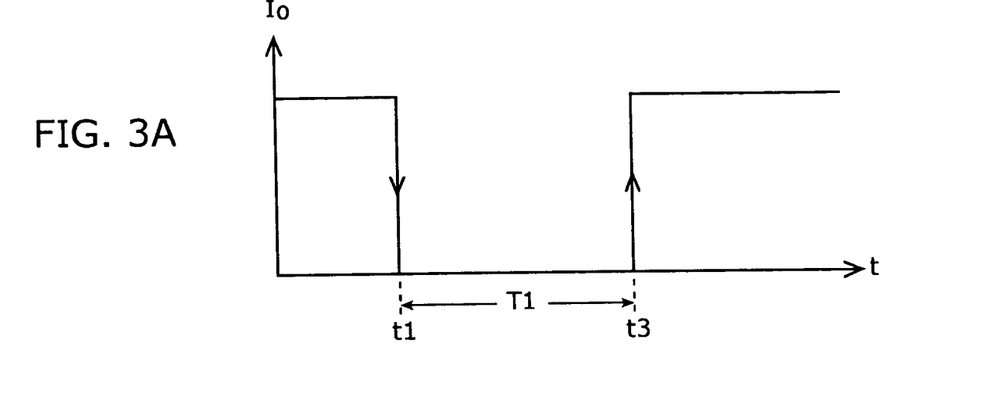
FIG. 3A is a waveform diagram showing the output currents of the n-channel FET driver with and without a sink current.
Figure 3B:
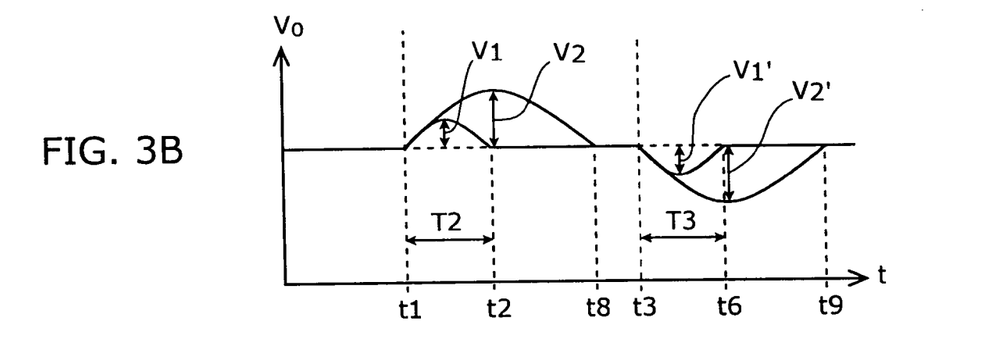
FIG. 3B is a waveform diagram showing the output voltages of the n-channel FET driver with and without a sink current.
Figure 3C:
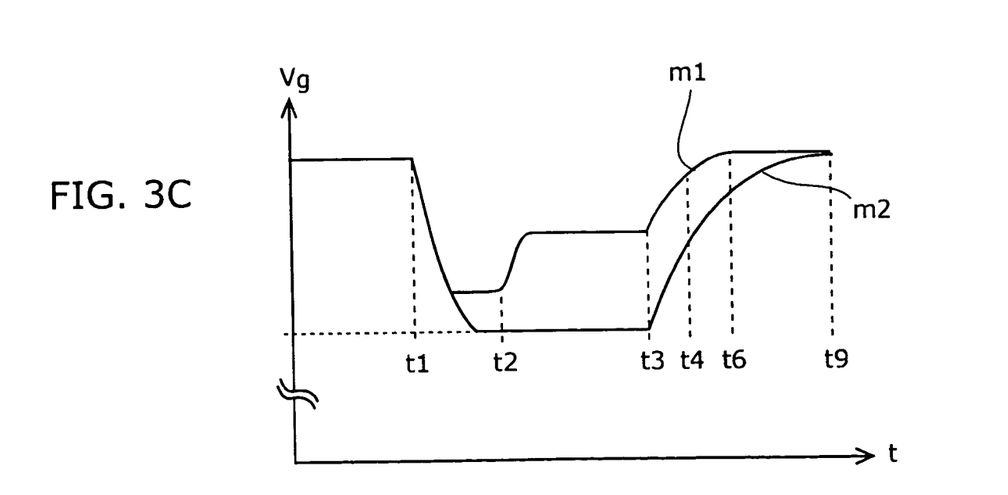
FIG. 3C is a waveform diagram showing the gate voltages of the output current control element in the n-channel FET driver with and without a sink current.

FIG. 3A is a waveform diagram showing the output current of the n-channel FET driver 100 with and without a sink current. FIG. 3B is a waveform diagram showing the output voltages of the n-channel FET driver 100 with and without a sink current. FIG. 3C is a waveform diagram showing the gate voltages of the output current control element in the n-channel FET driver 100 with and without a sink current.

In FIGS. 3A to 3C, such components as are found also in FIGS. 2A to 2C and FIGS. 5A to 5C are identified with the same reference symbols or numerals. In FIG. 3B, an output voltage Vo found in a period between the time point t1 and the time point t2 and having a fluctuation of the voltage V1 is shown as a voltage waveform when the sink current Ic is provided. Another output voltage Vo found in a period between the time point t1 and the time point t8 and having a fluctuation of the voltage V2 is shown as a voltage waveform when the sink current Ic is not provided. It is understood from these waveforms that the voltage V1 is smaller than the voltage V2 and, therefore, the transient response when the load is changed from the heavy load to no load is improved. Furthermore, the output voltage Vo found in a period between the time point t3 and the time point t6 and having a fluctuation of the voltage V1' is shown as a voltage waveform when the sink current is provided. The output voltage Vo found in a period between the time points t3 and the time point t9 and having a fluctuation of the voltage V2' is shown as a voltage waveform when the sink current is not provided. It is understood from these waveforms that the voltage V1' is smaller than the voltage V2' and, therefore, the transient response when the load is changed from no load to the heavy load is improved.

In FIG. 3C, a reference symbol m1 represents a line showing how the gate voltage Vg rises at the time point t3 when the sink current Ic pulled in by the constant current source 6 is provided, and a reference symbol m2 represents a line showing how the gate voltage Vg rises at the time point t3 when the sink current Ic is not provided. More specifically, when the sink current Ic is provided, the gate voltage Vg is kept raised by the sink current Ic after the time point t2, starts rising as shown by the line m1 at the time point t3, and reaches the predetermined voltage at the time point t6 after passing a substantial threshold value of the gate voltage at the time point t4. By contrast, when the sink current Ic is not provided, the gate voltage Vg stays at nearly zero between the time point t1 and the time point t3, starts rising as shown by the line m2 at the time point t3, and reaches the predetermined voltage at the time point t9.

As found in FIG. 3C, the time required for the gate voltage Vg to reach the predetermined voltage when the sink current Ic is provided is shorter than the time when the sink current Ic is not provided. With this arrangement, it is possible to make the FET 3 to respond faster and bring back the output voltage Vo to its predetermined level faster.

It is so arranged that the sink current Ic flows when the constant current source 6 operates. Therefore, as evident from the previous descriptions, there is no need for the sink current Ic to flow at all times. It is possible to control the flow of the sink current Ic in such a way that it turns on and off periodically or it turns on and off in synchronization with the changes of the load condition so that the sink current Ic flows continuously, for example, at least during a period between the time point t1 and the time point t3 as shown in FIG. 2C.

In addition, the amount of the sink current Ic caused by the constant current source 6 used in this embodiment is, for example, approximately 100 µA. The amount of the current Is that flows through the FET 7 when the FET 7 turns on for a very short period of time is, for example, in the order of a few dozen mA, although this amount varies in accordance with the amount of charge stored in the capacitor 4.

Furthermore, taking the FET 3 as an example, a relative gate voltage Vrg (i.e., gate voltage Vg–output voltage Vo) applied to the gate thereof varies to a certain extent depending on the amount of the output current (load current) Io. For example, assume that a threshold gate voltage of the FET 3 is about 1.2 V in FIG. 2C. Then, the circuit is configured in such a way that, when the output current Io is zero, the relative gate voltage Vrg varies in the range between 0 V and about 1.2 V (indicated as Vg1 in FIG. 2C); when the output current Io is 100 µA equivalent to the amount of the sink current Ic, the relative gate voltage Vrg is about 1.5 V (indicated as Vg2 in FIG. 2C); when the output current Io is 1 A equivalent to the current at heavy load, the relative gate voltage Vrg changes to about 2.0 V (indicated as a maximum Vg in FIG. 2C). It is to be noted that, because these figures vary according to the circuit configurations and the element types to be used therein, the present invention is not limited to these values.

According to the embodiment described above, when the load 5 changes from no load to a heavy load, the gate voltage of the n-channel FET 3, i.e., an output current control element, is raised by the sink current Ic that is pulled in by the constant current source 6 during the no-load period preceding the change in load condition. This makes it possible for the FET 3 to respond faster, thereby reduce fluctuations of the output voltage caused by fluctuating load conditions to a minimum, and, in addition, improve properties in the transient response.

When the load 5 changes from a heavy load to no load, the electrical charge is removed from the capacitor 4 by the n-channel FET 7, i.e., a switching element, being turned on. This makes it possible to suppress the rise of the output voltage. This, combined with the effect of the sink current Ic, makes the response speed of the FET 3 faster, further suppresses fluctuations of the output voltage caused by changes of the load, and, in addition, improves properties in the transient response.

Furthermore, n-channel FETs are used as the output current control element and the switching element. This makes it possible to reduce power consumption further.

In the afore-mentioned embodiment, described are the cases where the load 5 changes from no load to a heavy load and, also, from a heavy load to no load. However, when the load 5 changes from a light load to a heavy load and, also, from a heavy load to a light load, the differential amplifier 1 and the FET 3 operate in a like manner because of their operational linearity, and produce the same effects. Also, in the above-mentioned embodiment, although it is explained that the FET 7 removes the charge from the capacitor 4, the FET 7 can also remove the charge from a capacitance component in the line L1 in addition to the capacitor 4. This makes it possible to improve the speed of response to fluctuations of the load.

What is claimed is:

1. A power supply circuit comprising:
   a differential amplifier for feeding out a voltage as a control voltage in accordance with a difference between a feedback voltage commensurate with an output voltage and a reference voltage;
   an output current control element for feeding out an output current in accordance with the control voltage fed thereto from the differential amplifier;
   an output line by way of which the output current is supplied to a load;
   a feedback line by way of which a voltage on the output line is fed back as the feedback voltage to the differential amplifier, the feedback line connected to the output line;
   a switching element, connected between the feedback line and ground, for turning on in synchronization with a signal that turns off the output current control element; and
   a sink current generating circuit, connected between the feedback line and ground, for generating a sink current by which the control voltage fed to the output current control element is raised to a predetermined value.

2. A power supply circuit as claimed in claim 1, wherein the sink current generating circuit comprises a constant current source.

3. A power supply circuit as claimed in claim 1, wherein, the switching element, when being turned on, removes at least electrical charge from a capacitor connected between the output line and ground.

4. A power supply circuit as claimed in claim 1, wherein the switching element is an n-channel FET (field-effect transistor).

5. A power supply circuit as claimed in claim 1, wherein the output current control element is an n-channel FET (field-effect transistor).

6. A power supply circuit comprising:
   a first power supply terminal by way of which power from a first power supply is supplied;
   a second power supply terminal by way of which power from a second power supply is supplied;
   a differential amplifier, having a first input terminal for receiving a reference voltage and a second input terminal for receiving a voltage commensurate with an output voltage, the differential amplifier for feeding out, as a control voltage, a voltage that varies in accordance with a difference between the two voltages fed to the first and the second input terminals respectively;
   an inverter circuit, incorporated in the differential amplifier and connected between the second power supply terminal and ground, that feeds out the control voltage upon receiving an input signal for generating the control voltage;
   an FET transistor having a gate thereof for receiving the control voltage, a drain thereof connected to the first power supply terminal, and a source thereof connected to a load and the second input terminal of the differential amplifier, the FET transistor supplies an output voltage in accordance with the control voltage to the second input terminal of the differential amplifier and the load;
   a sink current generating circuit, connected between the source of the FET transistor and ground, for pulling in a sink current from the first power supply through the FET transistor, and
   a switching element, connected in parallel with the sink current generating circuit, that receives the input signal for generating the control voltage simultaneously with the inverter circuit,
   wherein the sink current improves a transient response of the FET transistor when the FET transistor changes from an off-state to an on-state, by raising the control voltage to a predetermined level during the off-state period.

7. A power supply circuit as claimed in claim 6, wherein the sink current generating circuit comprises a constant current source.

8. A power supply circuit as claimed in claim 6, wherein, when there is a capacitance component existing across the load, the switching element, when being turned on, removes from the capacitance component electrical charge stored therein so as to improve a transient response of the FET transistor measured during a transient period when the FET transistor changes from an on-state to an off-state.

9. A power supply circuit as claimed in claim 6, wherein the switching element is an n-channel FET (field-effect transistor).

10. A power supply circuit as claimed in claim 6, wherein the FET transistor is an n-channel FET (field-effect transistor).

* * * * *